United States Patent
Hogari et al.

(10) Patent No.: US 7,382,110 B2
(45) Date of Patent: Jun. 3, 2008

(54) METHOD OF CHARGING SECONDARY BATTERY, METHOD OF CALCULATING REMAINING CAPACITY RATE OF SECONDARY BATTERY, AND BATTERY PACK

(75) Inventors: Masaki Hogari, Fukushima (JP); Taichi Sasaki, Fukushima (JP)

(73) Assignee: Sony Corporation, Tokyo (JP)

( * ) Notice: Subject to any disclaimer, the term of this patent is extended or adjusted under 35 U.S.C. 154(b) by 239 days.

(21) Appl. No.: 11/106,866

(22) Filed: Apr. 15, 2005

(65) Prior Publication Data

US 2005/0237024 A1  Oct. 27, 2005

(30) Foreign Application Priority Data

Apr. 23, 2004 (JP) ............ P2004-128469
Apr. 28, 2004 (JP) ............ P2004-134016

(51) Int. Cl.
*H02J 7/00* (2006.01)
(52) U.S. Cl. ............ 320/132; 320/134; 320/150; 320/152; 324/427; 324/432
(58) Field of Classification Search ............ 320/132, 320/134, 150, 152; 324/427, 432
See application file for complete search history.

(56) References Cited

U.S. PATENT DOCUMENTS

| | | | | |
|---|---|---|---|---|
| 5,592,094 A | * | 1/1997 | Ichikawa | 324/427 |
| 6,294,894 B1 | * | 9/2001 | Ochiai et al. | 320/132 |
| 6,313,606 B1 | * | 11/2001 | Eguchi | 320/132 |
| 6,495,989 B1 | * | 12/2002 | Eguchi | 320/132 |
| 6,522,104 B1 | * | 2/2003 | Drori | 320/149 |
| 7,098,625 B2 | * | 8/2006 | Yumoto et al. | 320/132 |
| 7,136,762 B2 | * | 11/2006 | Ono | 702/63 |

FOREIGN PATENT DOCUMENTS

| | | |
|---|---|---|
| JP | 2000-012103 | 1/2000 |
| JP | 2001-153935 | 6/2001 |
| JP | 2002-006011 | 1/2002 |
| JP | 2002-305039 | 10/2002 |
| JP | 2003-035755 | 2/2003 |
| WO | 98/56059 | 12/1998 |

* cited by examiner

*Primary Examiner*—Bao Q. Vu
*Assistant Examiner*—Arun Williams
(74) *Attorney, Agent, or Firm*—Bell, Boyd & Lloyd LLP

(57) ABSTRACT

A method of changing a secondary battery, a method of calculating a remaining capacity rate of the secondary battery, and a battery pack are provided.

The method of charging a secondary battery includes the steps of: performing a detection of a charging rate of the secondary battery using an integrating method in which a battery capacity is calculated by integrating a current value or a power value of the secondary battery for a certain period of time, and a detection of the charging rate of the secondary battery using a voltage method in which a voltage value of the secondary battery is measured and the charging rate is calculated based on a correlation between the voltage value and the charging rate; and performing a weighted addition of the charging rate detected by the integrating method and the charging rate detected by the voltage method in accordance with the charging rate of the secondary battery, whereby detecting a final charging rate.

11 Claims, 10 Drawing Sheets

FIG. 6

| | | INTEGRATED VALUE |
|---|---|---|
| FIRST | 170/5.208=32(REMAINDER 3) | 32 |
| SECOND | (170+3)/5.208=33(REMAINDER 1) | 65 |
| THIRD | (170+1)/5.208=33(REMAINDER 4) | 97 |
| FOURTH | (170+4)/5.208=33(REMAINDER 2) | 130 |
| FIFTH | (170+2)/5.208=33(REMAINDER 0) | 163 |
| SIXTH | (170+0)/5.208=33(REMAINDER 3) | 195 |
| SEVENTH | (170+3)/5.208=33(REMAINDER 1) | 228 |
| EIGHTH | (170+1)/5.208=33(REMAINDER 4) | 260 |
| NINTH | (170+4)/5.208=33(REMAINDER 2) | 293 |
| TENTH | (170+2)/5.208=33(REMAINDER 0) | 326 |

METHOD OF CHARGING SECONDARY BATTERY, METHOD OF CALCULATING REMAINING CAPACITY RATE OF SECONDARY BATTERY, AND BATTERY PACK

CROSS REFERENCES TO RELATED APPLICATIONS

The present application claims priority to Japanese Patent Application No. P2004-128469 filed in the Japanese Patent Office on Apr. 23, 2004 and Japanese Patent Application No. P2004-134016 filed in the Japanese Patent Office on Apr. 28, 2004, the entire contents of which being incorporated herein by reference.

BACKGROUND OF THE INVENTION

The present invention relates to a method of charging a secondary battery, a method of calculating a remaining capacity rate of the secondary battery, and a battery pack.

Presently, for many of apparatuses used with batteries, a rechargeable secondary battery is used and charged with a charging apparatus at user's home and the like. These apparatuses are so configured as to indicate, by color or blinking of a lamp or a liquid crystal display manner, and the like, that a charge is in progress, or the charge is completed, or alternatively, to give an indication of a battery capacity for permitting a user to know a rough remaining usable time.

Methods of detecting a charging capacity and a remaining capacity of the secondary battery may include an integrating method in which the charging capacity is calculated by integrating a current or a power output and a voltage method in which determination is performed whether or not a full charge has been reached by measuring a battery voltage.

As described the above, the integrating method is of integrating the current or the power output, and is thus capable of detecting the absolute charging capacity without any influence of voltage fluctuation, thereby making detection of the charging capacity easy. Further, as shown in FIG. 1, a charging rate (the charging. capacity) increases linearly in an early period of the charging process, so that calculation of the charging rate may be performed accurately.

On the other hand, in the voltage method, it is defined such that the full charge is reached if a battery open-circuit voltage reaches 4.2V/cell, in a case of a lithium ion battery, for instance. For a case of a rechargeable battery containing a large number of cells, the full charge is defined as that the battery open-circuit voltage of one of the cells reaches 4.2V. Thus, the voltage method ensures the detection of the full charge by measuring the open-circuit voltage.

In order to detect a voltage value more precisely in the voltage measurement, it is preferable to stop a supply of the current during a measurement of the voltage with connecting no load. However, stopping of the current supply in practice is difficult in most cases because it requires complicated control. Even if the current supply for charging is stopped, a polarized voltage inside the battery may not be stabilized, thereby preventing from estimating the correct open-circuit voltage. In view of the above, there may be used a method in which the charging current and a battery current Imp (Impedance) are measured to detect the charging rate without stopping the supply of the charging current.

The above method assumes that the open-circuit voltage is estimated by subtracting an increased amount in the voltage due to an internal resistance of the battery and the charging current from a measured cell voltage. This enables a stable detection of the full charge.

However, a charging method using the above integrating method may need to accurately know, as one of required condition, the overall charging capacity of a pack is known. Accordingly, it is difficult to detect the full charge correctly if the overall charging capacity decreases due to deterioration or fluctuates with an ambient temperature, and may not be able to estimate correctly.

Further, if an error in the measurement occurred in the course of the charging process, the charging rate may not reach 100% as shown in FIG. 1, resulting in failure to accurately detect the full charge.

In case of that the voltage method is used, it is possible to estimate the open-circuit voltage if the charging current is small. However, as shown in FIG. 2, with increasing charging current value, a battery current Imp fluctuates due to an error in the battery direct current Imp or self-heat generation of the cells by the charging current, thereby preventing from obtain correct open-circuit voltage and resulting in failure to accurately detect the charging rate.

Available methods of detecting the remaining capacity of the secondary battery may include a detection method using the voltage method for detecting the remaining capacity of the secondary battery by measuring the battery voltage, and a detection method using the integrating method for calculating the remaining capacity of the secondary battery by measuring and integrating the voltage and the current.

The remaining capacity detection using the voltage method is of measuring a terminal voltage of the battery cell, and then calculating the remaining capacity based on a correlation between the voltage and the battery capacity (a remaining capacity rate) of the secondary battery, so that in the case of the lithium ion battery, for instance, the battery may be judged to be in a full charge condition if the battery voltage reaches 4.2V/cell, or to be in an over-discharge condition if the battery voltage decreases to 2.4V/cell, thereby making the measurement easy.

On the other hand, the remaining capacity detection using the integrating method may be classified into a current integrating method of measuring the current, and then integrating the measured current for each certain period of time, and a power integrating method of measuring the current and the voltage, then calculating the power output by means of a multiplication of the measured current by the measured voltage, and further integrating the calculated power output for each certain period of time. The above integrating methods are both effective in, after calculating a discharge current or a discharge power output, calculating the remaining capacity of the secondary battery from a ratio of the calculated discharge current or discharge power output to a serviceable current or power output supposed in the battery, thereby providing the stable detection of the remaining capacity without being affected by the voltage fluctuations.

However, the remaining capacity detection using the voltage method gives rise to a disadvantage such that accuracy in the detection of the remaining capacity in an intermediate potential range of the secondary battery is extremely degraded at the time of a discharge. This is because in the case of the lithium ion battery, for instance, the voltage in the intermediate potential range as shown in FIG. 9 is so substantially constant as to create no great voltage difference, resulting in a difficulty to detect the remaining capacity with using the voltage.

Further, the remaining capacity detection using the integrating method also gives rise to another disadvantage such that the accuracy in the detection of the remaining capacity is degraded when the end period of the discharge is reached. This is because the measurement error of the voltage and the current or heat loss causes an error to be so accumulated, together with the integrated current or power, as to cause a large error in the end period of the discharge, leading to a degradation of the accuracy.

In view of the above, another method is employed, in which the charging capacity is measured by using the integrating method in combination with the voltage method. This detecting method provides the detection of the charging capacity by using the integrating method from the start of the charging process until a time near the full charge, and then switches the integrating method to the voltage method when approaching to the full charge, permitting the measurement to be performed in regions where effects of the above methods are respectively maximized.

Further, another method is employed to detect the battery capacity using the integrating method in combination with the voltage method. The voltage method provides a high accuracy in the calculation of the capacity if the current of the secondary battery shows a small value, whereas it fails to obtain the accurate open-circuit voltage due to the fluctuations, and the like of the direct current Imp (Impedance) with the ambient temperature or the Imp inside the battery if the above current shows a large value, thereby preventing from accurately calculating the battery capacity. Further, the integrating method provides the high accuracy in the calculation of the capacity if the current of the secondary battery shows the large value, whereas it causes an increase in the integration error with decreasing current, resulting in the degradation of the accuracy in the calculation of the capacity.

In Pamphlet of International Publication Patent No. 98/056059, there is given a description of a method for performing the detection of the battery capacity using the current integrating method in combination with the voltage method. In consideration of characteristics of a current output that shows a constant value if the battery capacity is in a condition close to an empty and decreases as the battery capacity approaches to near the full charge, the detecting method described in the above prior art suggests to use the voltage method if the current output is smaller than a prescribed current value, and to use the current integrating method if the current output is larger than the prescribed current value. This detecting method may provide an increased accuracy in the calculation of the battery capacity by measuring the battery capacity by means of a switching between the voltage method and the integrating method.

However, there is a case where, in the above detecting method using the integrating method in combination with the voltage method, the switching from the integrating method to the voltage method does not always reach an agreement between the charging capacity (or the charging rate) measured by the integrating method and the charging capacity (or the charging rate) measured by the voltage method, thereby resulting some discontinuity between the measured values when the switching is performed. Further, in case where the switching from the integrating method to the voltage method is performed gradually, a method for forcibly correcting the measured values in order to concatenate the above measured values that are not in agreement with each other, so that it has been also disadvantage such that the accuracy in the measurement of the charging capacity or the charging rate is so degraded as to hinder the charging process.

SUMMARY OF THE INVENTION

The present invention relates to a method of charging a secondary battery, a method of calculating a remaining capacity rate of the secondary battery, and a battery pack.

Accordingly, it is desirable to provide a method of charging a secondary battery or a battery pack, which is capable of accurately charging to a full charge state even if deterioration of a rechargeable battery or an environmental change occurs. Further, it is desirable to provide a method of charging a secondary battery or a battery in which a charging capacity or a charging rate is accurately detected.

A lower accuracy in the detection of the remaining capacity at the time of the discharge gives rise to disadvantage such that the remaining usable time or the battery capacity appearing on a display of the apparatus may decrease so rapidly as to preventing the apparatus from servicing up to a pre-estimated time. Particularly, in business-purpose apparatuses containing the battery pack, an occurrence of the errors in the measurement of the remaining capacity or the remaining capacity rate may hinder the business-use, so that the detection of the remaining capacity with an extremely high accuracy is desired.

Accordingly, it is desirable to provide a method of calculating a remaining capacity rate of a secondary battery or a battery pack, which allow detection of the remaining capacity or the remaining capacity rate with a higher accuracy.

According to an embodiment of the present invention, there is provided a method of charging a secondary battery. The method includes: performing a detection of a charging rate of the secondary battery using an integrating method in which a battery capacity is calculated by integrating a current value or a power value of the secondary battery for a certain period of time, and a detection of the charging rate of the secondary battery using a voltage method in which a voltage value of the secondary battery is measured and the charging rate is calculated based on a correlation between the voltage value and the charging rate; and performing a weighted addition of the charging rate detected by the integrating method and the charging rate detected by the voltage method in accordance with the charging rate of the secondary battery, whereby detecting a final charging rate.

According to another embodiment of the present invention, there is provided a battery pack with a secondary battery. The battery pack includes: a measuring unit operable to measure a voltage and current of the secondary battery; and a battery capacity calculating unit. The battery capacity calculating unit includes: detecting means for detecting a charging rate of the secondary battery using an integrating method in which a battery capacity is calculated by integrating a current value or a power value of the secondary battery for a certain period of time; detecting means for detecting a charging rate of the secondary battery using a voltage method in which a voltage value of the secondary battery is measured and the charging rate is calculated based on a correlation between the voltage value and the charging rate; and means for performing a weighted addition of the charging rate detected by the integrating method and the charging rate detected by the voltage method in accordance with the charging rate of the secondary battery, whereby detecting a final charging rate.

According to a further embodiment of the present invention, there is provided a method of detecting a remaining capacity rate of a secondary battery. The method includes: performing a detection of a remaining capacity rate of the secondary battery using an integrating method in which a battery capacity is calculated by integrating a current value or a power value of the secondary battery for a certain period of time, and a detection of the remaining capacity rate of the secondary battery using a voltage method in which a voltage value of the secondary battery is measured and the remaining capacity rate is calculated based on a correlation between the voltage value and the remaining capacity rate; and performing a weighted addition of the remaining capacity rate detected by the integrating method and the remaining capacity rate detected by the voltage method in accordance with the remaining capacity rate of the secondary battery, whereby detecting a final remaining capacity rate.

According to yet another embodiment of the present invention, there is provided a battery pack with a secondary battery. The battery pack includes: a measuring unit operable to measure a voltage, current and temperature of the secondary battery; and a battery capacity calculating unit. The battery capacity calculating unit includes: detecting means for detecting a remaining capacity rate of the secondary battery using an integrating method in which a battery capacity is calculated by integrating a current value or a power value of the secondary battery for a certain period of time; detecting means for detecting a remaining capacity rate of the secondary battery using a voltage method in which a voltage value of the secondary battery is measured and the remaining capacity rate is calculated based on a correlation between the voltage value and the remaining capacity rate; and means for performing a weighted addition of the remaining capacity rate detected by the integrating method and the remaining capacity rate detected by the voltage method in accordance with the remaining capacity rate of the secondary battery, whereby detecting a final remaining capacity rate.

According to the present invention, the charging rate of the battery may be calculated with the high accuracy from an early period of the charging process, and the full charge may be accurately detected.

Further, according to the present invention, even if the battery remaining capacity obtained by the power integrating method (or the current integrating method) includes some error, correction by the voltage method may be performed as the discharging process approaches to near an end period of the process, so that the highly accurate detection of the remaining capacity may be provided.

Additional features and advantages of the present invention are described in, and will be apparent from, the following Detailed Description of the Invention and the figures.

BRIEF DESCRIPTION OF THE FIGURES

FIG. 6 illustrates an example of data integration in the case of a processing using an integrating method involving an addition of remainders.

DETAILED DESCRIPTION OF THE INVENTION

The present invention relates to a method of charging a secondary battery, a method of calculating a remaining capacity rate of the secondary battery, and a battery pack.

Various embodiments of the present invention are described below with reference to the accompanying drawings.

Figure 3:
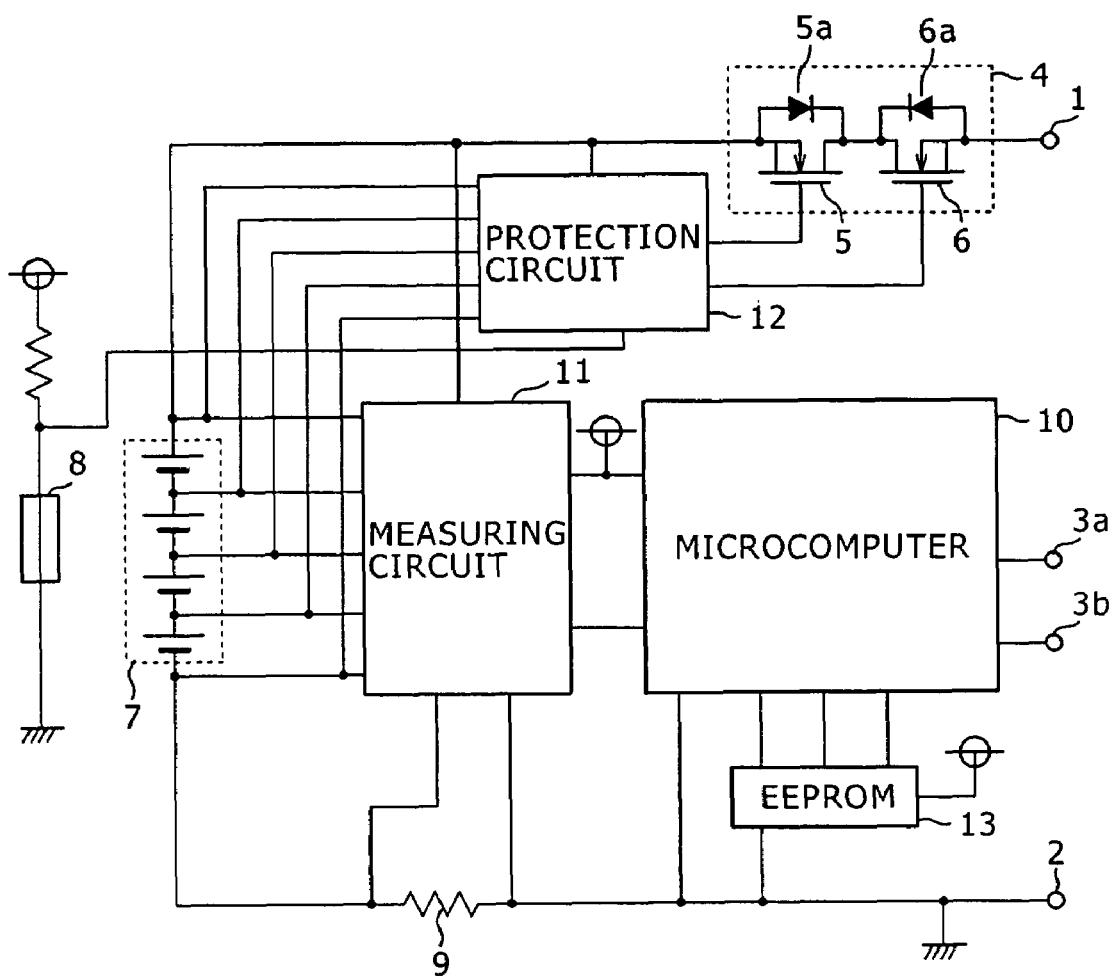
FIG. 3 is a schematic diagram showing an example of a structure of a battery pack according to an embodiment of the present invention.

FIG. 3 is a schematic diagram illustrating an example of a configuration of a battery pack according to an embodiment of the present invention.

The illustrated battery pack is mounted in a charging apparatus at the time of a charge, in which case, a plus terminal 1 and a minus terminal 2 are respectively connected to a plus terminal and a minus terminal of the charging apparatus to start the charging. Further, when an electric apparatus is operated with the battery pack, the plus terminal 1 and the minus terminal 2 are connected to a plus terminal and a minus terminal of the electric apparatus, like a connection at the time of the charge, to start the discharging.

The battery pack includes battery cells 7, a microcomputer 10, a measuring circuit 11, a protection circuit 12, a switch circuit 4, and communication terminals 3a and 3b.

The battery cells 7 include a secondary battery such as a lithium ion battery etc., and are formed in a serial connection of four pieces of the secondary batteries.

The microcomputer 10 is configured to perform, using a voltage value and a current value inputted from the measuring circuit 11, a measurement of the voltage value and an integration of the current value. Further, the microcomputer monitors a battery temperature with a temperature detecting element (a thermistor, for instance) indicated by reference numeral 8. Further, measured values and the like are stored in a non-volatile memory EEPROM (Electrically Erasable and Programmable Read Only Memory) indicated by reference numeral 13. Furthermore, the microcomputer 10 also performs a detection of voltage method reliability as needed.

The measuring circuit 11 measures a voltage of each of the battery cells 7 contained in the battery pack, and then send a measured voltage value to the microcomputer 10. Further, the measuring circuit measures a magnitude and a direction of the current using a current detection resistance 8 and to send a measured current value to the microcomputer 10. Further, the measuring circuit 11 also functions as a regulator serving to stabilize the voltage of the battery cells 7 and generate a supply voltage.

The protection circuit 12 prevents an overcharge and an overdischarge by supplying a control signal to the switch circuit 4, when the voltage of any one of the battery cells 7 reaches an overcharge detecting voltage, or the voltage of the battery cells 7 decreases to an overdischarge detecting voltage or less. In the protection circuit for the lithium ion battery, the overcharge detecting voltage is set to 4.2V±0.5V while the overdischarge detecting voltage is set to 2.4V±0.1V, for instance.

The switch circuit 4 includes a charge control FET (Field Effect Transistor) indicated by reference numeral 5, and a discharge control FET indicated by reference numeral 6. If the battery voltage reaches the overcharge detecting voltage, a charging current is so controlled as not to flow, with the charge control FET 5 switched OFF. After the charge control FET 5 is switched OFF, the discharge may be performed through a parasitic diode indicated by reference numeral 5a.

If the battery voltage decreases to the overdischarge detection voltage, a discharge current is so controlled as not to flow, with the discharge control FET 6 switched OFF. After the discharge control FET 6 is switched OFF, the charge may be performed through a parasitic diode indicated by reference numeral 6a.

The communication terminals 3a and 3b serve to, when the battery pack was mounted in an electric apparatus such as a Camcorder (that is an abbreviation for a Camera and Recorder), for instance, transmit information of a battery capacity to the electric apparatus. At the apparatus side having received the information of the battery capacity, a display unit such as a liquid crystal display is given an indication of a charging capacity and a charging rate.

In an embodiment, a detection of the charging capacity and a remaining capacity rate (the battery capacity) is performed by using an integrating method (a current or voltage integration) in combination with a voltage method. In the present invention, it should be noted that the measurement of the charging rate would not need to make complete switching between the integrating method and the voltage method at a certain threshold, but it uses both the integrating method and the voltage method at all the times. Further, in the present embodiment, the voltage method reliability, which defines how a value obtained by the voltage method is reliable, is calculated from values of the charging rate and the remaining capacity rate, and the final charging capacity and the final remaining capacity rate are obtained by weighted additions of the charging capacity obtained by the voltage method to the charging capacity obtained by the integrating method, and the remaining capacity rate to the remaining capacity rate obtained by the integrating method in accordance with the calculated voltage method reliability. By using the weighted additions of the charging rate by the voltage method and the remaining capacity rate by the voltage method as described the above, a gradual transition from the integrating method to the voltage method may be achieved.

If the calculation of the charging capacity and the remaining capacity rate with the integrating method involves a division calculation, decimal places contained in data are rounded off. This means that rounded-off values with less number of significant figures (the current values) are added-up, thereby cumulating the errors in the integrated value. As a result, an accuracy of an integrated current value is degraded, which also leads to a degradation of the accuracy in the detection of the charging rate.

In order to countermeasure such cumulative errors caused by dropping of the number of significant figures, a method of increasing the number of significant figures may be employed. However, such a method may require more memory space of the microcomputer, consuming processing resource. If available memory space in the microcomputer is not sufficient, it is difficult to increase the number of significant figures in practice. In such a case, data having less number of significant figures is accumulated, thereby casing degradation of the accuracy.

In view of the above, the present invention in an embodiment employs a following integrating method to minimize an effect of the decreasing the number of significant figures in data.

Figure 4:
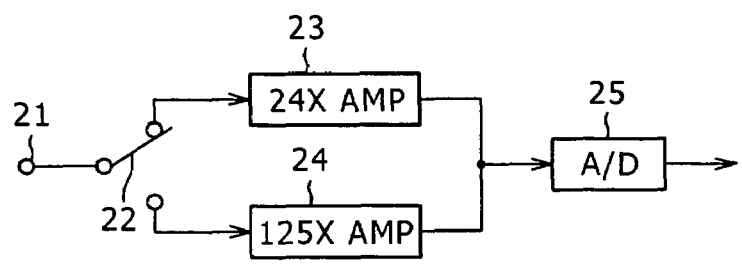
FIG. 4 is a schematic diagram showing a configuration for performing current integration or power integration with higher accuracy.

As shown in FIG. 4, at the time of the measurement of the current value, the connection between an amplifier 23 that provides a gain of 24 and an amplifier 24 that provides a gain of 125 is established through an input terminal 21 and a switch 22 to supply an output voltage from each amplifier to an A/D converter 25 of the microcomputer 10 for a conversion of the above output voltage into digital data. The above amplifiers are used depending on the current value. The 24× amplifier is used when the current value is larger than 2A while the 125× amplifier is used when the current value is equal to or less than 2A. This configuration can decrease the numeric difference between the significant figures in the case where the current value is small and those in the case where the current value is large.

However, the measured value having passed through the 24× amplifier 23 and the measured value having passed through the 125× amplifier are different in digit significance, and thus, may not be simply added. Accordingly, a following method is taken to minimize the adversary effect of the dropping the significant figures.

For instance, hardware requirements for the current measurement are specified as follows.

A/D reference voltage (AVREF): 3000 mV

A/D resolution: 1024 (10 Bit)

Current detection resistance (resistance 9 in FIG. 3): 5 mΩ

In this example, the voltage value supplied to the A/D converter 25 per 1 A of the current flowing through the battery cells 7 is calculated as follows.

For 24× amplifier 23:

$$5\ m\Omega \times 1\ A \times 24 = 120\ (mV/A) \quad (1)$$

For 125× amplifier 24:

$$5\ m\Omega \times 1\ A \times 125 = 625\ (mV/A) \quad (2)$$

Further, a voltage sensitivity per one resolution of the A/D converter 25 is calculated as 3000 mV/1024=2.930 (mV). This value may be converted into a current sensitivity of 2.930 (mV)/120 (mV/A)×1000≅24.41 (mA) for the 24× amplifier 24.

Figure 5:
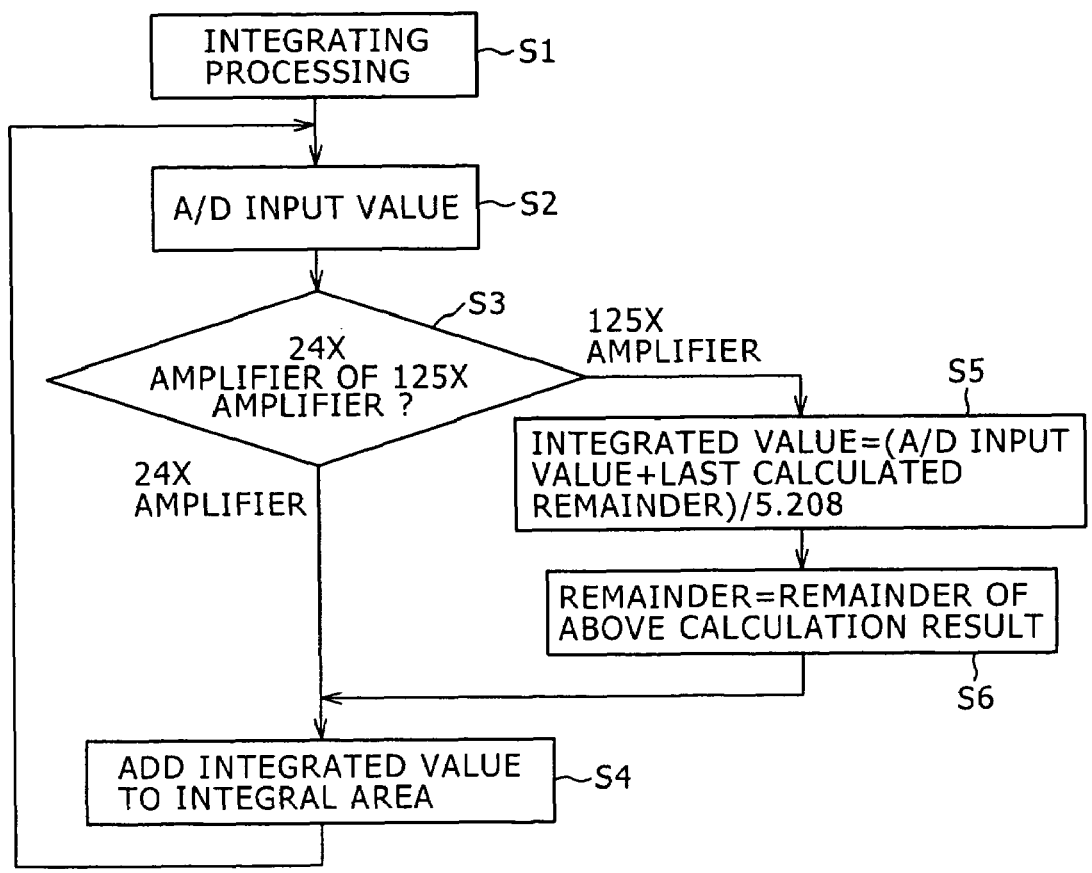
FIG. 5 is a flowchart showing steps of a process for performing current integration or power integration with higher accuracy.

A flow of an integrating processing is now described based on the above values with reference to a flowchart in FIG. 5.

First, when the integrating processing is started in Step S1, the measurement of the current value inputted to the A/D converter is performed with the current detection resistance 9 shown in FIG. 3, and the measured current value is supplied as an A/D input value to the microcomputer 10 (Step S2). Next, in Step S3, it is determined which of the 24× amplifier 23 and the 125× amplifier 24 should be used to measure the input value calculated in the Step S2. If the current value measured with the current detection resistance 9 is larger than 2 A, the 24× amplifier 23 is used, while when the above current value is equal to or less than 2 A, the 125× amplifier 24 is used.

If using the 24× amplifier 23, the calculation of an A/D input voltage is performed with the above expression (1).

For instance, if a discharge current is assumed to be 2.5 A, the A/D input voltage is given as 120 (mV/A)×2.5 A=300 (mV).

Further, when the A/D input voltage is converted into the digital data, an input value (an integrated value) having undergone an A/D conversion is given as 300 (mV)/2.930 (mV)≅102. In the case of the measurement using the 24× amplifier 23, the calculated integrated value is directly added to an integral area.

If using the 125× amplifier 24, the calculation of the A/D input voltage is performed with the above expression (2). For instance, when the discharge current is assumed to be 0.8 A, the A/D input voltage is given as 625 (mV/A)×0.8 A=500 (mV). Further, the input value (BATT_CURRENT_BIT) having undergone the A/D conversion is given as 300 (mV)/2.930 (mV)≅170.

In the case of the measurement using the 125× amplifier 24, the integration is initiated after the completion of the conversion that is so taken in the Step S5 as to obtain the same digit significance as that is assumed to be obtained in the measurement using the 24× amplifier 24 (a first integrating processing is conditioned to specify a remainder in the last integrating processing as 0). The conversion of 170 obtained as the input value having undergone the A/D conversion into a value assumed to be obtained in the measurement using the 24× amplifier 24 results in 170/5.208=32 with a remainder of 3.344. The integrated value is obtained as 32 with the remainder of 3 by rounding off the decimal places contained in the remainder in Step S6, and 32 is added to the integral area.

A description is now given about the case where the integrating processing is conducted ten times, with the discharge current maintained as constant as 0.8 A. If no addition of the remainders is required in disregard of the remainders, the integrated value is specified as 32×10 (times)=320, in which case, theoretically, the calculation of the integrated value using 170 obtained as the input value previous to the conversion results in {170×10 (times)}/5.208≅326, so that a difference of 6 between the above integrated values is created.

Accordingly, the integrating processing is performed by adding the remainder obtained in the last division processing to a value obtained in the current calculation. That is, a determination of an integrated value in the second integrating processing is made by adding 3 obtained as the remainder in the first integrating processing to 170 obtained in the second integrating processing as the input value previous to the conversion, and then converting the sum. The integrating processing on and after the third cycle takes the conversion of the total sum after the addition of the remainder obtained in the last integrating processing to the input value previous to the conversion like the second integrating processing.

FIG. 6 shows a condition of the integrating processing from the first to the tenth. As the result of the integrating processing in the manner of adding the remainders, the value of the integral area in the present embodiment reaches 326, in other words, no error is generated. Thus, the effect of the dropping the number of significant figures may be eliminated as much as possible by taking the division processing after the addition of the remainder obtained in the last calculation to the A/D input value.

Further, because there may be no need to increase the number of significant figures, it is possible to hold down the memory space required for the microcomputer 10 to the minimum.

Figure 7:
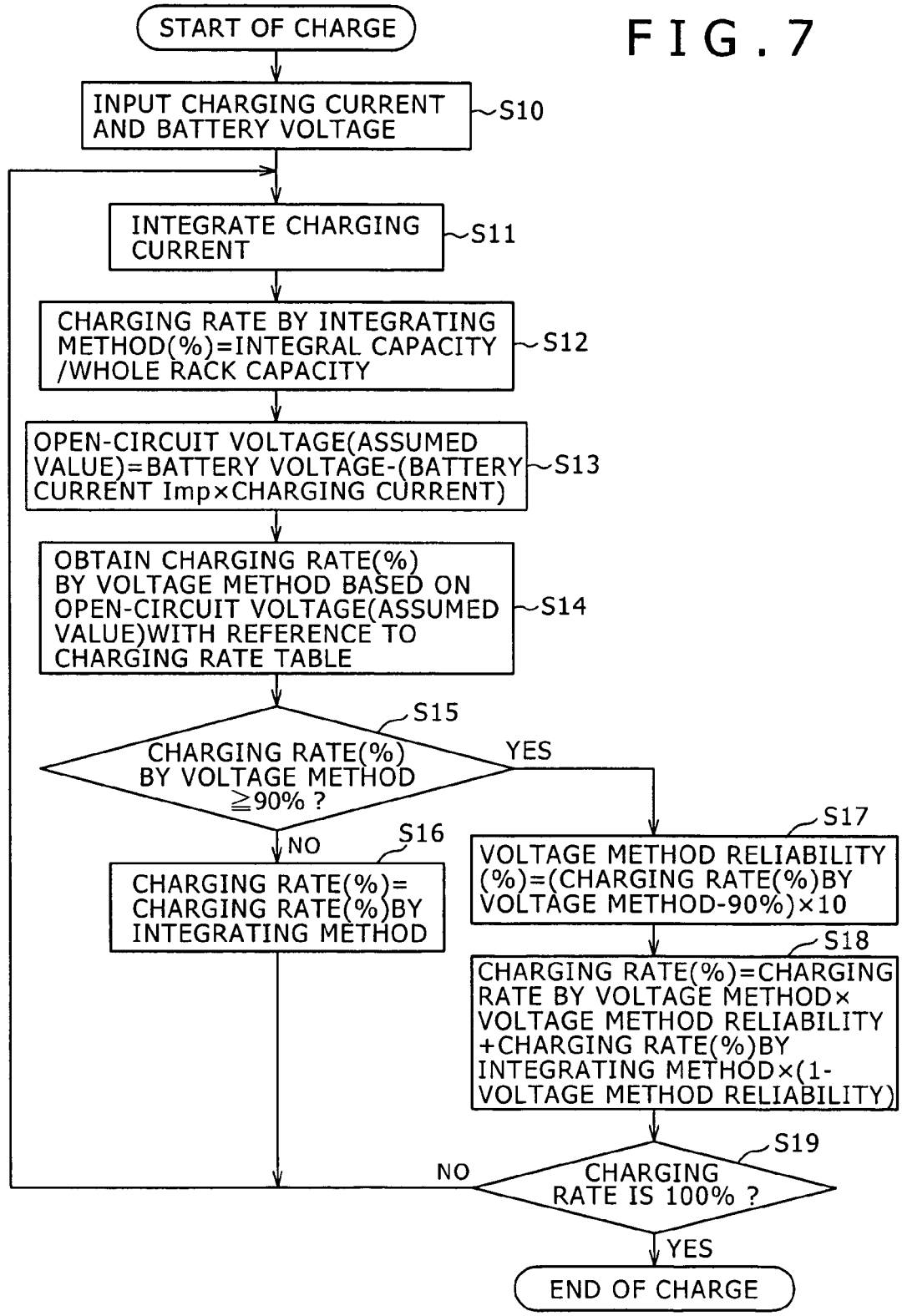
FIG. 7 is a flowchart showing a flow of a charging method according to an embodiment of the present invention.

A flow in the case of a processing of charging the battery pack described the above is now described with reference to a flowchart in FIG. 7.

The calculation of the charging rate from an early period to a middle period of the charge is performed using the typical integrating method. A processing relating to the current value in Steps S10 and S11 is the same as the processing in the Steps S1 to S6 of FIG. 5. Next, in Step S12, the charging rate (%) is calculated. The charging rate (%) by using the integrating method may be obtained from the following expression.

Charging rate (%) by integrating method=Integral capacity/Whole pack capacity

Further, in order to calculate the charging rate by the voltage method in parallel to the integrating method like Step S14, the voltage value is also inputted to the microcomputer 10 in the Step S10, in addition to the current value. The current is flowing through the battery cells 7, so that it is difficult to measure the voltage that is in a no-load state. Thus, in Step S13, an open-circuit voltage is assumed as follows.

Open-circuit voltage (Assumed value)={Battery voltage−(Battery current Imp×Charging current)}

Further, the charging rate (%) by the voltage method is obtained in the Step S14 based on the obtained open-circuit voltage with reference to a charging rate table (100% of the charging rate is specified by 4.2V of the battery voltage, for instance) established by a correlative association between the voltage and the charging rate. In Step S15, it is judged, based on the calculated charging rate by the voltage method, whether or not the charge is in a condition close to the full charge (the charging rate by the voltage method=90%, for instance). If it is judged that the charge is not in the condition close to the full charge, the processing is returned to the Step S11 via Step S16 and further performs the calculation of the open-circuit voltage and the charging rate by the voltage method, while keeping up the charging.

Alternatively, the detection of the charging capacity (the charging rate) by the integrating method and the detection of the charging capacity (charging rate) by the voltage method may be performed in such a manner as to change the order of the processing, or to be both processed in parallel.

If the charge reaches the end period, and is then judged to be in the condition close to the full charge, the calculation of the voltage method reliability (0 to 100%) is performed using the charging rate by the voltage method (Step S17). The voltage method reliability (%) may be calculated by a following expression, provided that 90% of the charging rate by the voltage method is specified as a criterion for detecting that the charge is in the condition close to the full charge, for instance.

$$\text{Voltage method reliability (\%)} = \{\text{Charging rate (\%) by Voltage method} - 90\%\} \times 10 \text{ (where the charging rate by the voltage method} \geq 90)$$

The above voltage method reliability is determined by taking advantage of the accuracy in the calculation of the charging rate near the full charge by the voltage method. With the voltage method reliability specified as constant as 0 until the charging rate by the voltage method reaches near the full charge, the voltage method reliability increases with the increase in the charging rate by the voltage method therefrom until 100% of the reliability is attained at the time of the full charge.

Further, the calculation of (1−Voltage method reliability (%)) is performed using the above voltage method reliability (%) to obtain the integrating method reliability (%). Further, the weighted addition using the voltage method reliability is taken to calculate the final charging rate by adding a value obtained by multiplying the voltage method reliability by the charging rate (%) by the voltage method to a value obtained by multiplying the integrating method reliability by the charging rate (%) by the integrating method (Step S18).

$$\text{Charging rate (\%)} = \text{Charging rate by voltage method} \times \text{Voltage method reliability} + \text{Charging rate by integrating method} \times (1 - \text{Voltage method reliability})$$

Next, it is judged whether or not the charging rate calculated in the Step S18 reaches 100%, and when the result of the judgment is less than 100%, a further continuation of the charge is required, while when the above result is 100%, the charge is finished (Step S19).

Figure 8:
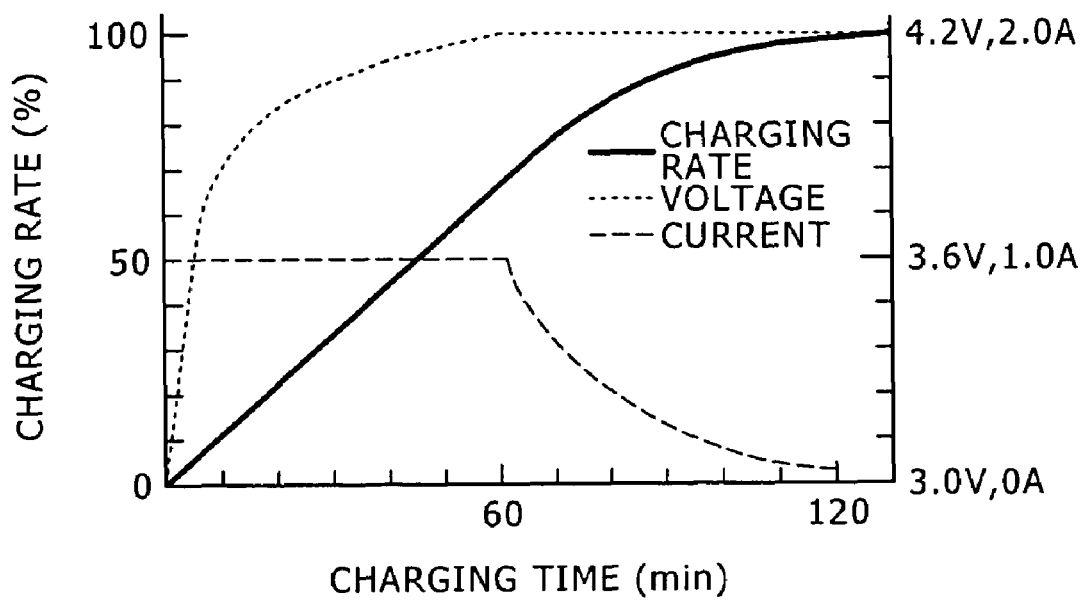
FIG. 8 is a graph showing examples of a current, voltage, and charging rate if a charging process of a secondary battery is performed in accordance with an embodiment of the present invention.
Figure 9:
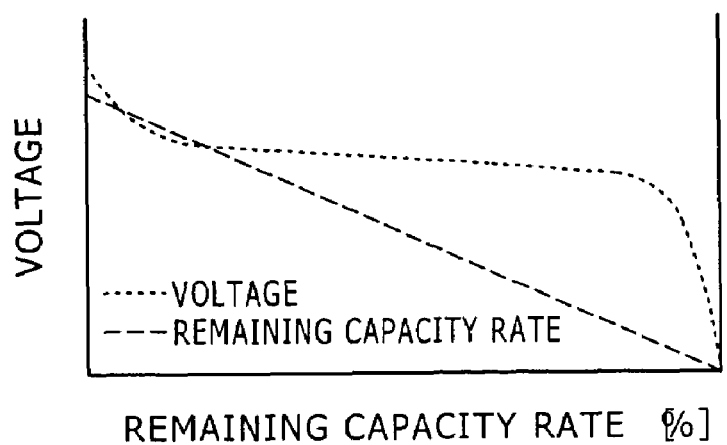
FIG. 9 is a graph showing a voltage and a remaining capacity rate in the case of discharging a secondary battery.

The use of the above method is effective in providing smooth transition from the value calculated by the integrating method to the value calculated by the voltage method depending on a ratio based on a multiplication by the voltage method reliability, even if there is the difference in charging rate between the values respectively calculated by the voltage method and the integrating method. Furthermore, the above method enables to realize the charging process that is like a plotted graph of the charging rate shown in FIG. 8, permitting the detection of the full charge to be performed accurately and easily.

Further, it becomes unnecessary to be excessively stuck to the accuracy of the integration, permitting the system to be configured with inexpensive and simple elements.

Further, a CCCV (Constant Current Constant Voltage) system is applied to a case where the lithium ion battery is used, so that it takes time to detect the charging rate on the approach of the full charge. Thus, if the accuracy in the calculation of the charging rate on the approach to the full charge is lower, the accuracy in the detection of a remaining time to charge also decreases. On the other hand, the use of the above method makes it possible to detect the charging capacity accurately, so that the accuracy in the calculation of the remaining time to charge is also increased.

The present invention in an embodiment uses the remaining capacity rate by the integrating method at the start of the discharge, followed by a gradual change to the remaining capacity rate by the voltage method. The detection of the remaining capacity by the voltage method is also required on the approach of the end period of the discharge to surely keep a cut-off voltage and 0% of the remaining capacity rate in coincidence at the end period of the discharge, so that the switching to the voltage method is performed completely.

The switching between the voltage method and the integrating method (the current or the voltage integration) in the case of the detection of the remaining capacity rate may require a parameter, which is also called the voltage method reliability, to calculate the final remaining capacity rate by means of, in accordance with the voltage method reliability, the weighted addition of the remaining capacity rate obtained by the voltage method to the remaining capacity rate obtained by the integrating method. The weighted addition involving the use of the remaining capacity rate by the voltage method as described the above provides the stable detection without an abrupt change of the remaining capacity rate.

The voltage method reliability is specified as the parameter that determines in what ratio the value measured by the voltage method is reliable for the use of the detection depending on environmental conditions or load conditions.

The reliability of the integrating method is expressed by {100(%)−Voltage method reliability (%)}. In calculation of the voltage method reliability, a final reliability is calculated by combining the following three types of the coefficients: a reliability coefficient dependent on the discharge voltage; a reliability coefficient dependent on the remaining capacity rate by the voltage method; and a reliability coefficient dependent on a temperature to calculate.

Below, the description is provided as to how each of the reliability coefficients dependent on the discharge voltage, the reliability coefficient dependent on the remaining capacity rate by the voltage method, and the reliability coefficient dependent on the temperature are calculated, and a method of calculating the voltage method reliability.

Figure 10:
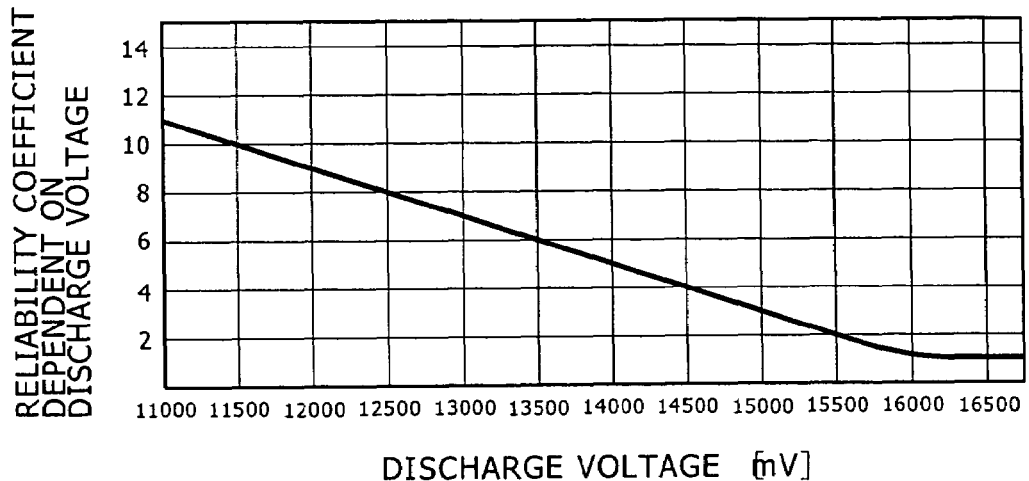
FIG. 10 is a graph showing a relationship between a discharge voltage of a secondary battery and a reliability coefficient dependent on a discharge voltage.

As shown in FIG. 10, the reliability coefficient dependent on the discharge voltage is supposed to provide a reliability coefficient increase as the voltage decreases, and thus can be calculated by a following expression. If the result of the reliability coefficient obtained by the following expression is less than 1, the reliability coefficient is specified as 1.

Reliability coefficient dependent on discharge voltage=−0.002×Discharge voltage (mV)+33

If the discharge voltage value is assumed to be 12800 mV, for instance, the reliability coefficient dependent on the discharge voltage is given as −0.002×12800+33=7.

Figure 11:
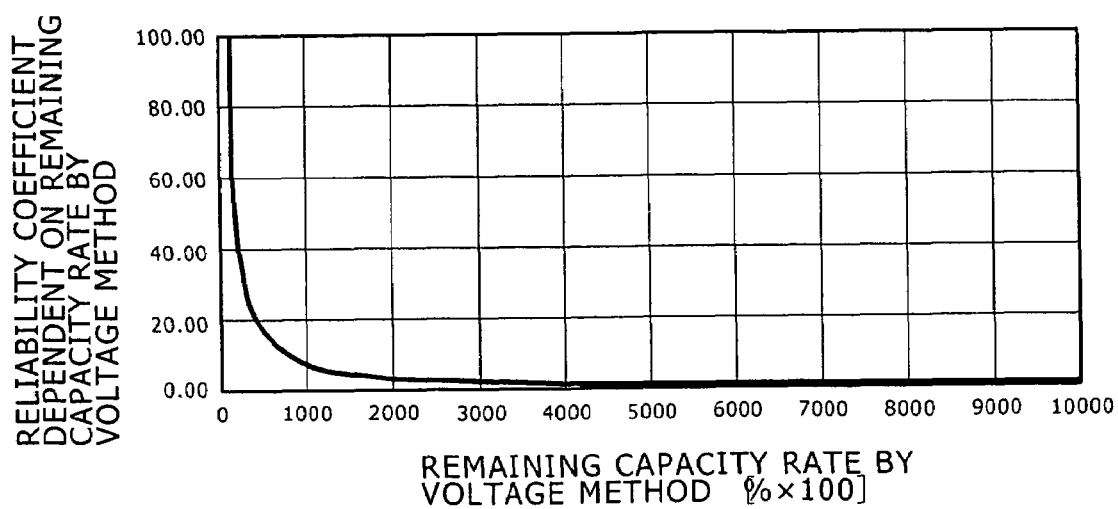
FIG. 11 is a graph showing a relationship between a remaining capacity rate of a secondary battery by a voltage method and a reliability coefficient dependent on the remaining capacity rate by a voltage method.
Figure 12:
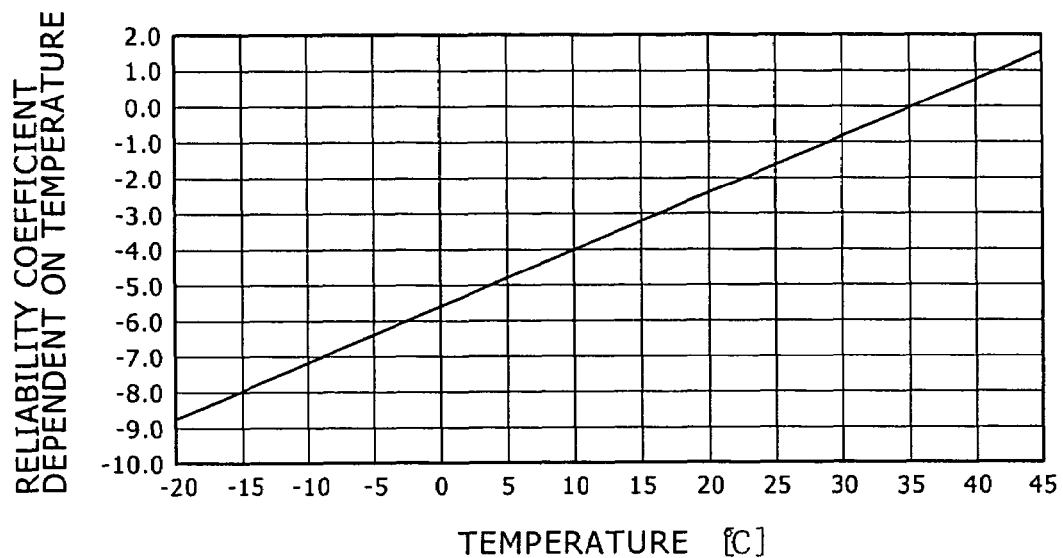
FIG. 12 is a graph showing a relationship between a temperature of a secondary battery and a reliability coefficient dependent on the temperature.

As shown in FIG. 11, the reliability coefficient dependent on the remaining capacity rate by the voltage method is supposed to provide a reliability coefficient increase abruptly as the remaining capacity rate by the voltage method decreases, and thus may be calculated by a following expression. If the result of the reliability coefficient obtained by the following expression is less than 1, the reliability coefficient is specified as 1. If the remaining capacity rate by the voltage method results in 20%, for instance, a substitution of 2000 as a value obtained by multiplying 20% by 100 is supposed to be taken as the remaining capacity rate by the voltage method in the following expression.

Reliability coefficient dependent on remaining capacity rate (%) by voltage method=(10000−Remaining capacity rate (%×100)) by voltage method/(Remaining capacity rate (%×100) by voltage method×1.2)+0.1

If the remaining capacity rate by the voltage method is assumed to be 20%, for instance, the reliability coefficient dependent on the remaining capacity rate by the voltage method is given as (10000−2000)/(2000×1.2)+0.1=3.43.

Further, an internal resistance of the secondary battery increases as the temperature decreases, so that it is necessary to take also a change with the temperature into consideration. For instance, it is a good assumption that an ambient temperature available for the electric apparatus mounted with the secondary battery varies from 30° C. or above to a freezing point or below. In this case, the internal resistance is supposed to increase as largely as by several times or above, and a difference of the internal resistance leads to the degradation of the accuracy in the measurement of the remaining capacity rate.

The reliability coefficient dependent on the temperature is supposed to provide a linear increase as the temperature increases, and thus may be calculated by a following expression.

Reliability coefficient dependent on temperature=0.16×temperature (° C.)−5.6

If the temperature is assumed to be 15° C., for instance, the reliability coefficient dependent on the temperature is given as 0.16×15−5.6=−3.2.

The calculation of the voltage method reliability that defines how much the calculated value is reliable is performed using the above three types of the reliability coefficients for the substitution of the respective coefficients into a following expression.

Voltage method reliability (%)=(Reliability coefficient dependent on discharge voltage+Reliability coefficient dependent on temperature)×Reliability coefficient dependent on remaining capacity rate by voltage method.

If the reliability coefficient dependent on the discharge voltage, the reliability coefficient dependent on the remaining capacity rate by the voltage method, and the reliability coefficient dependent on the temperature are respectively assumed to be 7, 3.43, and −3.2, for instance, the voltage method reliability (%) is given as (7−3.2)×3.43=13.03(%). Hereupon, when the result of the sum of (Reliability coefficient dependent on discharge voltage+Reliability coefficient dependent on temperature) is equal to or less than 1, a value of the above sum is specified as 1.

Figure 13:
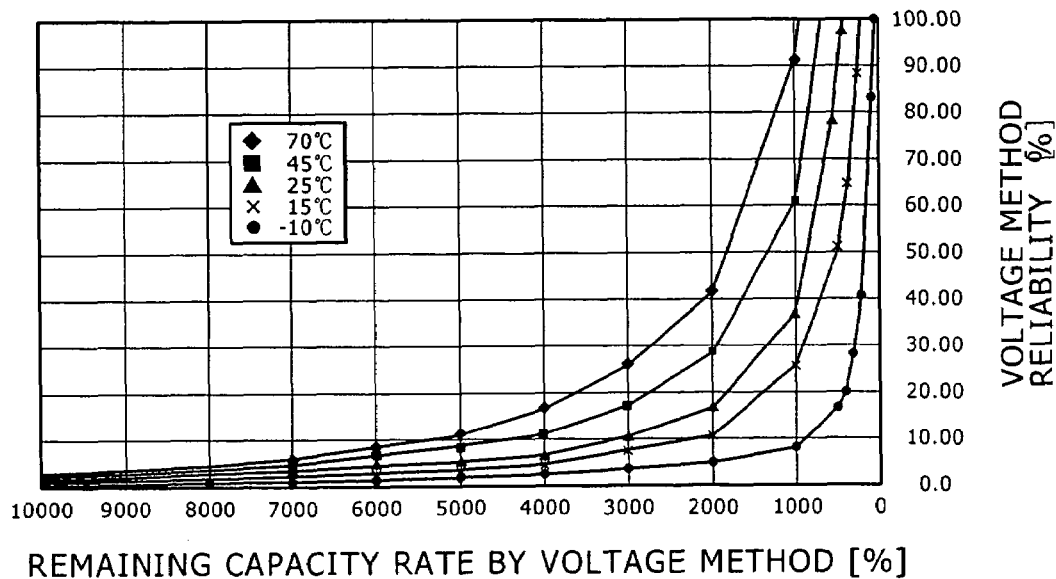
FIG. 13 is a graph showing a relationship between a remaining capacity rate of a secondary battery by a voltage method and voltage method reliability for each temperature.

FIG. 13 shows a relationship between the remaining capacity rate (%) by the voltage method and the voltage method reliability (%) both obtained by the above method. In FIG. 13, there are shown graphs for different temperatures. The expression for calculating the voltage method reliability is so established as to adapt the features of the voltage method reliability as follows, after consideration of one feature such that the detection using the voltage method causes the lower accuracy in the measurement of the remaining capacity in the range of the intermediate potential, and the other such that the detection using the power integrating method causes the lower accuracy in the measurement in the end period of the discharging process. The voltage method reliability is given in the range of 0 to 100%, and as the higher reliability, the remaining capacity rate by the voltage method is used with a higher ratio.

1. Use the detection result of the remaining capacity by the voltage integrating method in the range of the remaining capacity rate from 100 to about 30%.

2. Use the value obtained by adding the remaining capacity by the voltage integrating method to the remaining capacity rate by the voltage method in accordance with the ratio based on the voltage method reliability in the range of the remaining capacity rate from 30 to about 5%.

3. Use the detection result of the remaining capacity rate by the voltage method in the range of the remaining capacity rate of equal to or less than 5%.

Figure 14:
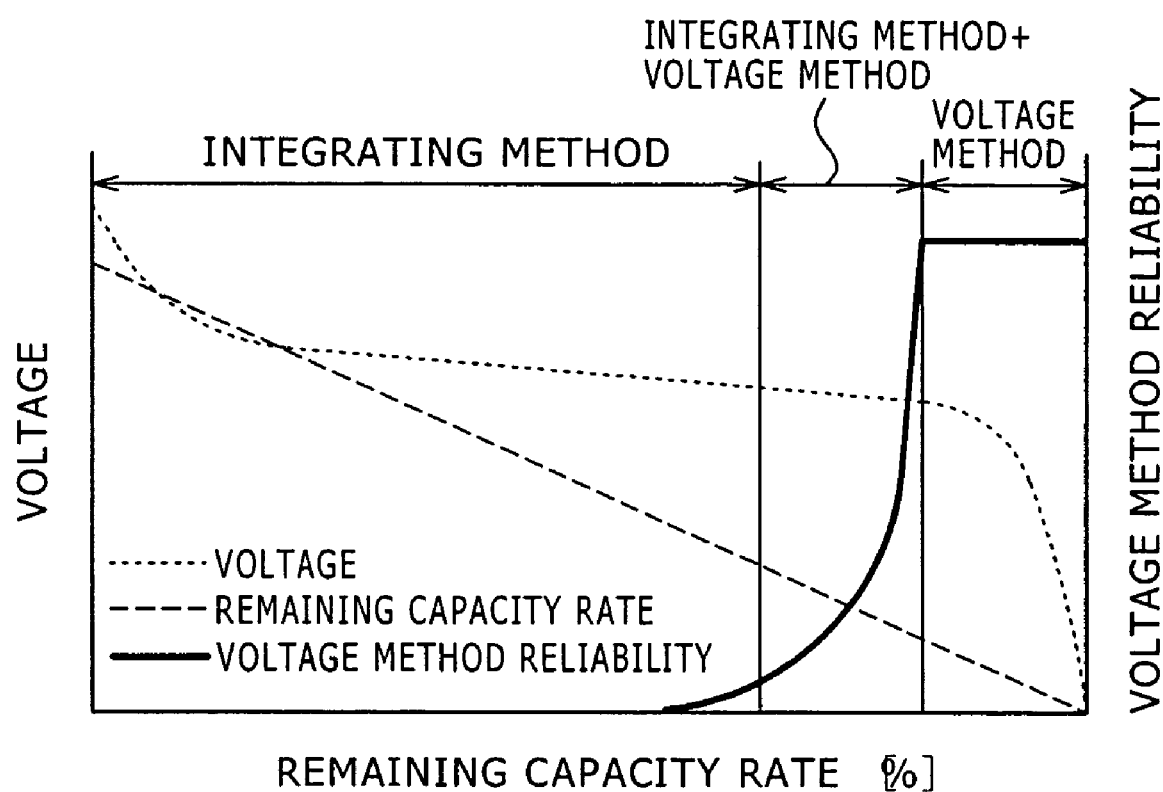
FIG. 14 is a view showing a voltage and a remaining capacity rate of a secondary battery during discharge, together with a method of detecting a voltage method reliability and a remaining capacity both obtained by an application of an embodiment of the present invention.

In an embodiment, as shown in FIG. 14, the integrating method is used at the start of the discharge, and the voltage method at the end period of the discharge, and the final remaining capacity rate (%) is calculated, in the range of the intermediate potential, by means of the weighted addition of the remaining capacity rate by the voltage method to the remaining capacity rate by the integrating method in accordance with the voltage method reliability calculated from the above expression. The weighted addition involving the use of the remaining capacity rate by the voltage method as described the above provides the gradual transition from the integrating method to the voltage method.

Figure 15:
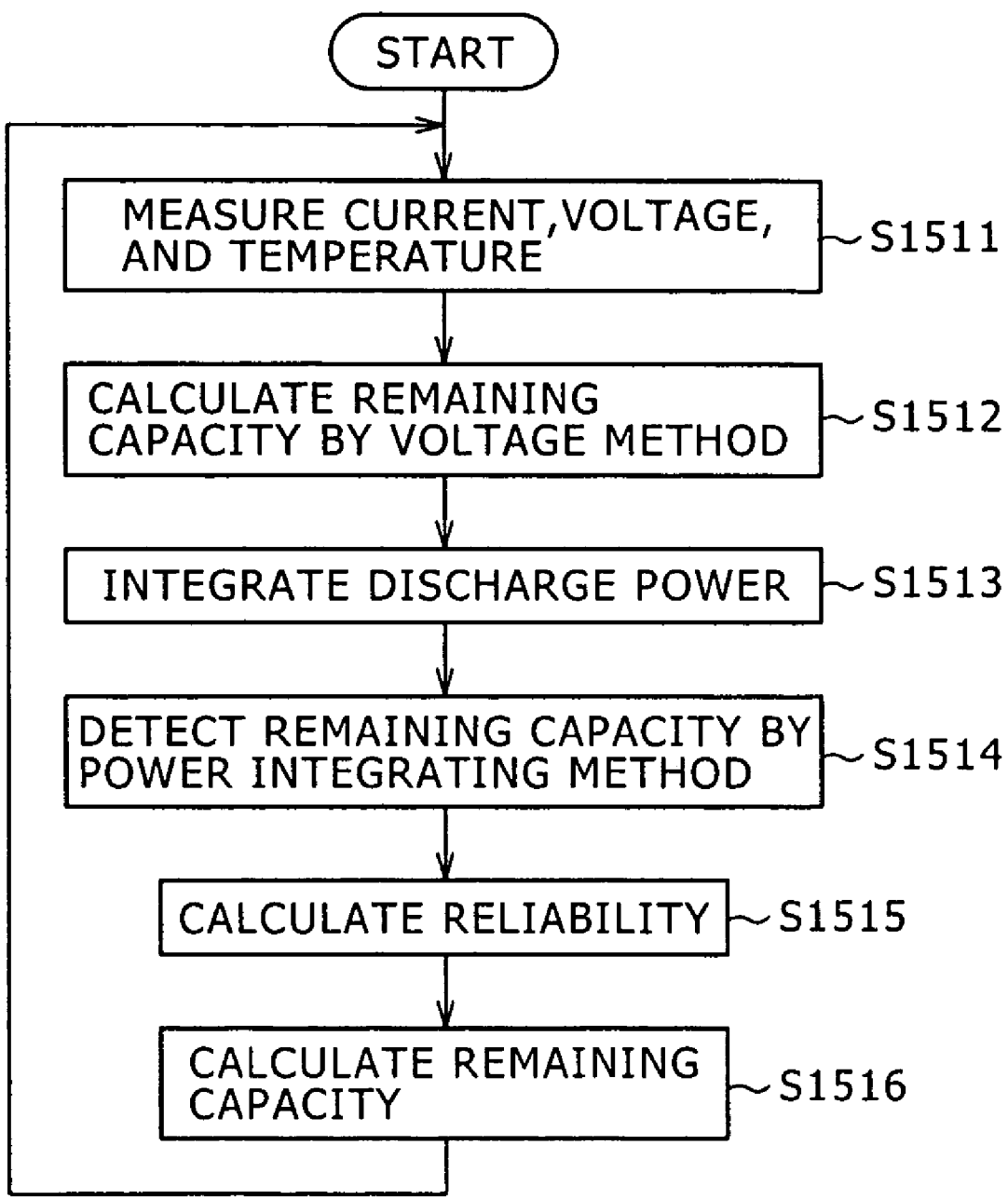
FIG. 15 is a flowchart showing a method of calculating s remaining capacity using voltage method reliability.

A method of detecting the remaining capacity of the battery pack using the above voltage method reliability is now described with reference to a flowchart in FIG. 15.

Figure 1:
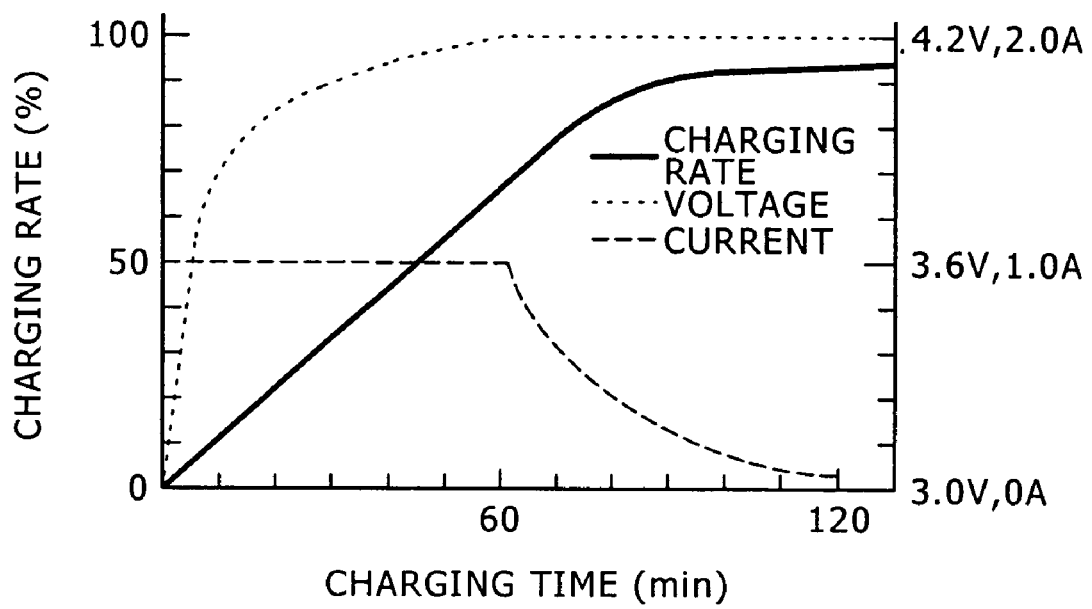
FIG. 1 is a graph showing a charging time in an integrating method, a charging rate, a voltage and a current of a battery in a related art.
Figure 2:
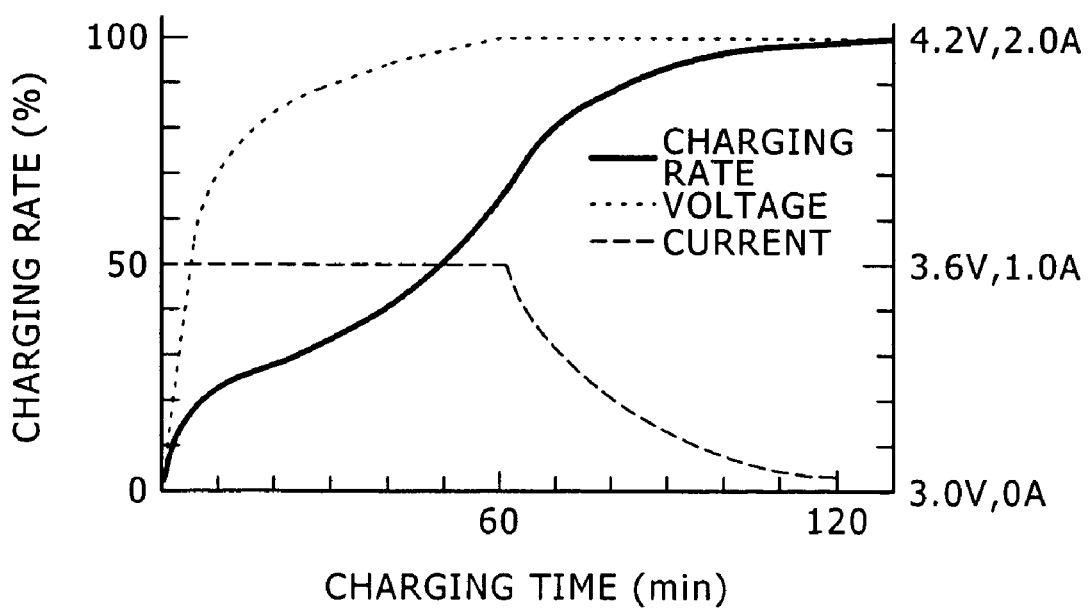
FIG. 2 is a graph showing a charging time in a voltage method, a charging rate, a voltage, and a current of a battery in a related art.

When a processing of calculating the remaining capacity is started, the battery cells 7, the current measurement resistance 9, and the thermistor 8 shown in FIG. 2 respectively measure the discharge voltage, the discharge current, and the temperature, and supply each measured value to the microcomputer 10 (Step S1511).

The microcomputer 10 performs the detection of the remaining capacity by the voltage method based on the supplied voltage value (Step S1512). The microcomputer calculates a non-loaded measured voltage by adding a dropped voltage calculated in terms of (Current×Impedance) to the supplied measured voltage to obtain the remaining capacity of the secondary battery from characteristic curved data representing the relationship between the voltage and the remaining capacity rate of the secondary battery. The data representing the relationship between the voltage and the remaining capacity rate of the secondary battery may be obtained in advance by deriving a relationship from experimental data, thereby providing a data table associating the voltage and the capacity. A capacity may be calculated from the corresponding voltage employing the data table.

Next, the calculation of the discharge power (power=current×voltage) from the measured current and voltage is performed in the microcomputer 10. The calculated discharge power is subjected to integrating processing for every certain period of time to obtain an integrated power output having been integrated since the start of the discharging process (Step S1513). In Step S1514, the calculation of the remaining capacity rate is performed based on the ratio of the integrated power output obtained in the Step S1513 to secondary battery dischargeable power preliminarily obtained from the experimental data. Specifically, the remaining capacity rate is obtained from a following expression.

Remaining capacity rate (%)=Integral power/dischargeable power×100

Next, the calculation of the voltage method reliability for determining which of the remaining capacity rate calculated by the voltage method and the remaining capacity rate calculated by the power integrating method is preferentially used is performed (Step S1515). The voltage method reliability is calculated using the reliability coefficient dependent on the discharge voltage, the reliability coefficient dependent on the remaining capacity rate by the voltage method, and the reliability coefficient dependent on the temperature.

After the voltage method reliability is calculated in the Step S1515, the calculation of (1−Voltage method reliability (%)) is performed using the voltage method reliability (%) to obtain the integrating method reliability (%). Further, the weighted addition involving the use of the voltage method reliability is taken to calculate the final remaining capacity rate by adding the value obtained by multiplying the voltage method reliability by the remaining capacity rate (%) by the voltage method to the value obtained by multiplying the integrating method reliability by the remaining capacity rate by the integrating method (%) (Step S1516).

If the remaining capacity rate by the voltage method, the remaining capacity rate by the power integrating method, and the voltage method reliability are respectively assumed to be 30%, 40%, and 20%, for instance, the final remaining capacity rate is obtained as 38% by calculation of 30×0.20+ 40×(1−0.20).

At the point of time when the remaining capacity rate reaches 0% as the result of the measurement of the remaining capacity rate using the above method, the discharging process ends.

The use of the above method is effective in detecting the remaining capacity rate with the high accuracy because of the use of the voltage method for the detection in the region near the end period of the discharge, and also of detecting the remaining capacity by the power integrating method (or the current integrating method) in the region near the range of the intermediate potential that is supposed to cause the accuracy in the measurement using the voltage method to be degraded when the lithium ion battery is used, for instance, so that the detection of the remaining capacity rate may be provided at all times with the high accuracy from the start to the end of the discharge.

While the embodiment of the present invention has been specifically described in the foregoing, it is to be understood that the present invention is not limited to the above embodiment, and various modifications based on a technical concept of the present invention may be made.

For instance, the numerical values given in the above embodiment are no more than an example, and it is also allowable to use numerical values different from the above as needed.

Further, the present invention is also applicable to various types of batteries such as Ni—Cd (Nickel-Cadmium) battery and Ni-MH (Nickel-Hydrogen) battery, in addition to the above lithium ion battery.

Furthermore, the microcomputer contained in the battery pack may also be in a form of a microcomputer that provides a function of the protection circuit as well.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A method of charging a secondary battery, comprising:
performing a detection of a charging rate of the secondary battery using an integrating method in which a battery capacity is calculated by integrating a current value or a power value of the secondary battery for a certain period of time, and a detection of the charging rate of the secondary battery using a voltage method in which an open-circuit voltage value of the secondary battery is measured and the charging rate is calculated based on a correlation between the open-circuit voltage value and the charging rate; and
performing a weighted addition of the charging rate detected by the integrating method and the charging rate detected by the voltage method in accordance with the charging rate of the secondary battery, whereby detecting a final charging rate using the weighted addition when the charging rate by the voltage method is at least 90 percent further comprising detecting a final charging rate using the integrating method when the charging rate by the voltage method is less than 90 percent.

2. The method of charging a secondary battery according to claim 1, further comprising:
setting in advance a reference charging rate in the voltage method for detecting whether or not a full charge is in a vicinity during a charging process;
performing the charging rate detection using the integration method if the charging rate of the secondary battery is less than the reference charging rate; and
performing the weighted addition of the charging rate detected by the integrating method and the charging rate detected by the voltage method in accordance with the charging rate thereof, whereby detecting a final charging rate.

3. The method of charging a secondary battery according to claim 1, wherein:
weighting factors used in the weighted addition are obtained from a voltage method reliability calculated based on a reference charging rate by the voltage method.

4. A battery pack with a secondary battery, the battery pack comprising:
a measuring unit operable to measure a voltage and current of the secondary battery; and
a battery capacity calculating unit;
wherein the battery capacity calculating unit includes:
detecting means for detecting a charging rate of the secondary battery using an integrating method in which a battery capacity is calculated by integrating a current value or a power value of the secondary battery for a certain period of time;
detecting means for detecting a charging rate of the secondary battery using a voltage method in which open-circuit voltage value of the secondary battery is measured and the charging rate is calculated based on a correlation between the open-circuit voltage value and the charging rate; and
means for performing a weighted addition of the charging rate detected by the integrating method and the charging rate detected by the voltage method in accordance with the charging rate of the secondary battery, whereby detecting a final charging rate using the weighted addition when the charging rate by the voltage method is at least 90 percent the battery capacity calculating unit detects a final charging rate using the integrating method when the charging rate by the voltage method is less than 90 percent.

5. The battery pack according to claim 4, wherein:
the battery capacity calculating unit sets in advance a reference charging rate in the voltage method for detecting whether or not a full charge is in a vicinity during a charging process; and
the battery pack further includes means for performing the charging rate detection using the integration method if the charging rate of the secondary battery is less than the reference charging rate; and performing the weighted addition of the charging rate detected by the integrating method and the charging rate detected by the voltage method in accordance with the charging rate thereof, whereby detecting a final charging rate.

6. The battery pack according to claim 4, wherein:
the battery capacity calculating unit includes means for obtaining weighting factors used in the weighted addition from a voltage method reliability calculated based on a reference charging rate by the voltage method.

7. A method of detecting a remaining capacity rate of a secondary battery, the method comprising:
performing a detection of a remaining capacity rate of the secondary battery using an integrating method in which a battery capacity is calculated by integrating a current value or a power value of the secondary battery for a certain period of time;
performing a detection of the remaining capacity rate of the secondary battery using a voltage method in which a voltage value of the secondary battery is measured and the remaining capacity rate is calculated based on a correlation between the voltage value and the remaining capacity rate; and
performing a weighted addition of the remaining capacity rate detected by the integrating method and the remaining capacity rate detected by the voltage method in accordance with the remaining capacity rate of the secondary battery, whereby detecting a final remaining capacity rate, wherein the voltage method is given full weight at an end period of discharge performing the remaining capacity rate detection using the integration method if the remaining capacity rate of the secondary battery is high; performing the weighted addition of the remaining capacity rate detected by the integrating method and the remaining capacity rate detected by the voltage method in accordance with the remaining capacity rate thereof if the remaining capacity rate of the secondary battery is low; and performing the remaining capacity rate detection using the voltage method at an end period of discharge.

8. The method of detecting a remaining capacity rate of a secondary battery according to claim 7, wherein:
weighting factors used in the weighted addition are obtained from a voltage reliability that combines a reliability coefficient obtained from a discharging voltage of the secondary battery, a reliability coefficient according to a remaining capacity rate obtained from the voltage method, and a reliability coefficient according to a temperature obtained from a battery temperature of the secondary battery.

9. A battery pack with a secondary battery, comprising:
a measuring unit operable to measure a voltage, current and temperature of the secondary battery; and
a battery capacity calculating unit;
wherein the battery capacity calculating unit includes:
detecting means for detecting a remaining capacity rate of the secondary battery using an integrating method in which a battery capacity is calculated by integrating a current value or a power value of the secondary battery for a certain period of time;
detecting means for detecting a remaining capacity rate of the secondary battery using a voltage method in which a voltage value of the secondary battery is measured and the remaining capacity rate is calculated based on a correlation between the voltage value and the remaining capacity rate; and
means for performing a weighted addition of the remaining capacity rate detected by the integrating method and the remaining capacity rate detected by the voltage method in accordance with the remaining capacity rate of the secondary battery, whereby detecting a final remaining capacity rate, wherein the voltage method is given full weight at end period of discharge the battery capacity calculating unit performs the remaining capacity rate detection using the integration method if the remaining capacity rate of the secondary battery is high; performs the weighted addition of the remaining capacity rate detected by the integrating method and the remaining capacity rate detected by the voltage method in accordance with the remaining capacity rate thereof if the remaining capacity rate of the secondary battery is low; and performs the remaining capacity rate detection using the voltage method at an end period of discharge.

10. The battery pack according to claim 9, wherein:
the battery capacity calculating unit obtains weighting factors used in the weighted addition from a voltage reliability that combines a reliability coefficient obtained from a discharging voltage of the secondary battery, a reliability coefficient according to a remaining capacity rate obtained from the voltage method, and a reliability coefficient according to a temperature obtained from a battery temperature of the secondary battery.

11. A battery pack with a secondary battery, the battery pack comprising:
a measuring unit operable to measure a voltage and current of the secondary battery; and
a battery capacity calculating unit;
wherein the battery capacity calculating unit includes:
a first detector operable to detect a charging rate of the secondary battery using an integrating method in which a battery capacity is calculated by integrating a current value or a power value of the secondary battery for a certain period of time;
a second detector operable to detect a charging rate of the secondary battery using a voltage method in which an open-circuit voltage value of the secondary battery is measured and the charging rate is calculated based on a correlation between the open-circuit voltage value and the charging rate; and
a weighted addition device operable to perform a weighted addition of the charging rate detected by the integrating method and the charging rate detected by the voltage method in accordance with the charging rate of the secondary battery, whereby detecting a final charging rate using the weighted addition when the charging rate by the voltage method is at least 90 percent the battery capacity calculating unit detects a final charging rate using the integrating method when the charging rate by the voltage method is less than 90 percent.

* * * * *